(12) United States Patent
Nishimura

(10) Patent No.: US 12,474,631 B2
(45) Date of Patent: Nov. 18, 2025

(54) PELLICLE FRAME, PELLICLE, EXPOSURE ORIGINAL PLATE WITH PELLICLE, EXPOSURE METHOD, AND SEMICONDUCTOR OR LIQUID-CRYSTAL-DISPLAY MANUFACTURING METHOD

(71) Applicant: Shin-Etsu Chemical Co., Ltd., Tokyo (JP)

(72) Inventor: Akinori Nishimura, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 664 days.

(21) Appl. No.: 17/793,462

(22) PCT Filed: Jan. 15, 2021

(86) PCT No.: PCT/JP2021/001288
§ 371 (c)(1),
(2) Date: Jul. 18, 2022

(87) PCT Pub. No.: WO2021/149615
PCT Pub. Date: Jul. 29, 2021

(65) Prior Publication Data
US 2023/0061797 A1 Mar. 2, 2023

(30) Foreign Application Priority Data
Jan. 21, 2020 (JP) ................................ 2020-007569

(51) Int. Cl.
*G03F 1/64* (2012.01)
*G03F 7/00* (2006.01)
*H01L 21/027* (2006.01)

(52) U.S. Cl.
CPC ............ *G03F 1/64* (2013.01); *G03F 7/70358* (2013.01); *G03F 7/70983* (2013.01); *H01L 21/0274* (2013.01)

(58) Field of Classification Search
CPC .... G03F 1/64; G03F 7/70358; G03F 7/70983; G03F 7/70633; G03F 7/709
See application file for complete search history.

(56) References Cited

U.S. PATENT DOCUMENTS 9,841,670 B2* 12/2017 Kohmura ............ G03F 7/70866
10,642,151 B2* 5/2020 Ishito ..................... C25D 11/04
(Continued)

FOREIGN PATENT DOCUMENTS

JP 2001-109135 A 4/2001
JP 2005-308901 A 11/2005
(Continued)

OTHER PUBLICATIONS

International Search Report issued in corresponding International Patent Application No. PCT/JP2021/001288 dated Mar. 9, 2021.
(Continued)

*Primary Examiner* — Stewart A Fraser
(74) *Attorney, Agent, or Firm* — Morgan, Lewis & Bockius LLP

(57) ABSTRACT

The present invention provides a pellicle frame, a pellicle, an exposure original plate with the pellicle, an exposure method, and a semiconductor or liquid-crystal-display manufacturing method, the pellicle frame constituting a pellicle for photolithography.

17 Claims, 1 Drawing Sheet

(56) References Cited

U.S. PATENT DOCUMENTS

| | | | |
|---|---|---|---|
| 2005/0140949 A1 | 6/2005 | Jasper et al. | |
| 2016/0139502 A1* | 5/2016 | Chua | G03F 1/64 430/5 |
| 2018/0180991 A1* | 6/2018 | Nishimura | G03F 1/62 |

FOREIGN PATENT DOCUMENTS

| | | | |
|---|---|---|---|
| JP | 2005-338722 | A | 12/2005 |
| JP | 2009-128477 | A | 6/2009 |
| JP | 2010-102357 | A | 5/2010 |
| JP | 2011-099946 | A | 5/2011 |
| JP | 2017-122830 | A | 7/2017 |
| JP | 2018-508048 | A | 3/2018 |
| WO | 2012/080008 | A2 | 6/2012 |

OTHER PUBLICATIONS

European Search Report dated Feb. 8, 2024, issued in corresponding European Patent Application No. 21743649.2.

* cited by examiner

PELLICLE FRAME, PELLICLE, EXPOSURE ORIGINAL PLATE WITH PELLICLE, EXPOSURE METHOD, AND SEMICONDUCTOR OR LIQUID-CRYSTAL-DISPLAY MANUFACTURING METHOD

TECHNICAL FIELD

This invention relates to a pellicle frame, pellicle, pellicle-covered exposure original plate and exposure method, and method for manufacturing a semiconductor device or liquid crystal (LC) display.

BACKGROUND ART

The method for manufacturing semiconductor devices or LC displays includes the photolithography step of irradiating light to resist-coated semiconductor wafers or LC matrices to print patterns. If dust is deposited on photomasks and reticles (referred to as photomask, hereinafter) used herein, the dust absorbs or deflects light, raising such problems that the transferred pattern can be deformed or roughened at the edge, and the background be stained black, detracting from size, quality, appearance and other factors.

Although these photolithography steps are generally performed in a cleanroom, it is yet difficult to always maintain the exposure original plate clean. It is thus a common practice to attach a dust cover, known as pellicle, to the exposure original plate before exposure.

The pellicle is basically constructed as comprising a frame-shaped pellicle frame, a pellicle film extended on the upper end surface of the pellicle frame, and a gas-tight gasket formed on the lower end surface of the pellicle frame. The pellicle film is composed of a material having a high transmittance to exposure radiation. A pressure-sensitive adhesive (PSA) is used as the gas-tight gasket.

When the pellicle is placed on the photomask, contaminants do not deposit directly on the photomask, but on the pellicle. If a focus is set on the pattern of the photomask during photolithography transfer, the contaminants on the pellicle do not participate in the transfer, avoiding such problems as pattern deformation.

The photolithography technology encounters an advance to modify the exposure light source toward shorter wavelength as the means for enhancing resolution. Until the present, the exposure light source makes a transition from g-line (436 nm) and i-line (365 nm) of mercury lamps to KrF excimer laser (248 nm). In recent years, the ArF excimer laser (193 nm) is most often used when micropatterning is necessary.

In the recent efforts for implementing further microprocessing using ArF excimer laser, an immersion exposure tool is used. The exposure tool is given a higher numerical aperture (NA) by filling a liquid between the objective lens and a silicon wafer in the tool whereby a higher resolution is achieved. With such an increase of NA of the exposure tool, the light transmitted by the pellicle has an increased angle of oblique incidence in a peripheral portion. The transmittance of the pellicle is generally set such that a maximum transmittance is available with respect to perpendicular incident light. There is observed a phenomenon that the transmittance lowers as the incident angle becomes larger. The extent of transmittance lowering becomes more outstanding as the pellicle film becomes thicker. For obtaining a high transmittance relative to oblique incident light, it is a common practice to reduce the thickness of a pellicle film.

However, reducing the thickness of a pellicle film raises the problem that the strength of the film is concomitantly lowered. Specifically, since the photomask unit assembled by attaching a pellicle to a photomask substrate undergoes high-speed scanning motion in the exposure step, a pellicle film having a low strength is susceptible to vibration under the influence of turbulent flow during high-speed scanning motion. That is, as the pellicle film vibrates, the exposure light tends to be disturbed upon passage through the pellicle film. The pattern is shifted from the original plately intended position, with a possibility that the positional accuracy or overlay of the pattern is aggravated.

Of the prior art technology associated with the overlay improving process, the following patent documents are exemplary.

PRIOR ART DOCUMENTS

Patent Documents

Patent Document 1: JP-A 2018-508048
Patent Document 2: WO 2012/080008

SUMMARY OF INVENTION

Technical Problem

An object of the invention, which has been made under the above-mentioned circumstances, is to provide a pellicle frame which can suppress turbulent flow which is likely to occur upon high-speed scanning motion, mitigate the vibration of a pellicle film upon high-speed scanning motion during exposure, and restrain any overlay aggravation; a pellicle using the same, pellicle-covered exposure original plate and exposure method, and method for manufacturing a semiconductor device or LC display.

Solution to Problem

Making extensive investigations to solve the outstanding problems, the inventor has found that by tailoring an outer peripheral portion of a pellicle frame to a specific streamline shape, air flow separation is mitigated and air resistance is reduced, and as a result, the turbulent flow upon high-speed scanning motion is suppressed and the aggravation of overlay after exposure is restrained. The invention is predicated on this finding.

Accordingly, the invention provides a pellicle frame, pellicle, pellicle-covered exposure original plate and exposure method, and method for manufacturing a semiconductor device or LC display as defined below.
1. A pellicle frame to construct a photolithography pellicle, having an outer peripheral surface which is streamline shaped, wherein the width of the outer peripheral surface portion of streamline shape is at least 50% of the height of the pellicle frame.
2. A pellicle frame including a portion having an outer peripheral surface which is streamline shaped, wherein the width of the outer peripheral surface portion of streamline shape is at least 50% of the height of the pellicle frame.
3. The pellicle frame of 1 or 2 wherein the streamline shape is arcuate.
4. The pellicle frame of 1 or 2, having one side (or lower end surface side) adapted to be mounted on an exposure original plate and another side (or upper end surface side) adapted to bear a pellicle film, wherein the width (w) of the pellicle frame on the one side is greater than the width (B) of the pellicle frame on the other side.

5. The pellicle frame of 1 or 2 wherein the width (B) of the pellicle frame is up to 60% of the width (w) of the pellicle frame.

6. The pellicle frame of 1 or 2 wherein the outer peripheral surface is shaped such that its width gradually decreases from one side (or lower end surface side) adapted to be mounted on an exposure original plate to another side (or upper end surface side) adapted to bear a pellicle film.

7. A pellicle comprising the pellicle frame of 1 or 2 and a pellicle film.

8. The pellicle of 7 wherein the pellicle film has a thickness of up to 500 nm.

9. The pellicle of 7 which is subject to exposure at a scanning speed of at least 300 mm/sec.

10. A pellicle-covered exposure original plate comprising an exposure original plate and the pellicle of 7 mounted thereon.

11. An exposure method comprising the step of exposing a substrate to radiation through the pellicle-covered exposure original plate of 10.

12. The exposure method of 11 wherein the substrate is exposed at a scanning speed of at least 300 mm/sec.

13. A method for manufacturing a semiconductor device comprising the step of exposing a substrate to radiation through the pellicle-covered exposure original plate of 10.

14. The method of 13 wherein in the exposure step, the substrate is exposed at a scanning speed of at least 300 mm/sec.

15. A method for manufacturing a liquid crystal display comprising the step of exposing a substrate to radiation through the pellicle-covered exposure original plate of 10.

16. The method of 15 wherein in the exposure step, the substrate is exposed at a scanning speed of at least 300 mm/sec.

Advantageous Effects of Invention

The inventive pellicle frame whose outer shape is tailored to a streamline shape can suppress the turbulent flow which is otherwise likely to occur upon high-speed scanning motion, mitigate the vibration of a pellicle film by high-speed scanning motion during exposure, and restrain any overlay aggravation, as compared with prior art pellicle frames, and is thus effective for forming a small size pattern. Accordingly, the pellicle, the pellicle-covered exposure original plate and exposure method, and the method for manufacturing a semiconductor device or LC display are useful in the lithography technology.

DESCRIPTION OF EMBODIMENTS

One embodiment of the invention is described below in detail although the invention is not limited thereto.

Figure 1:
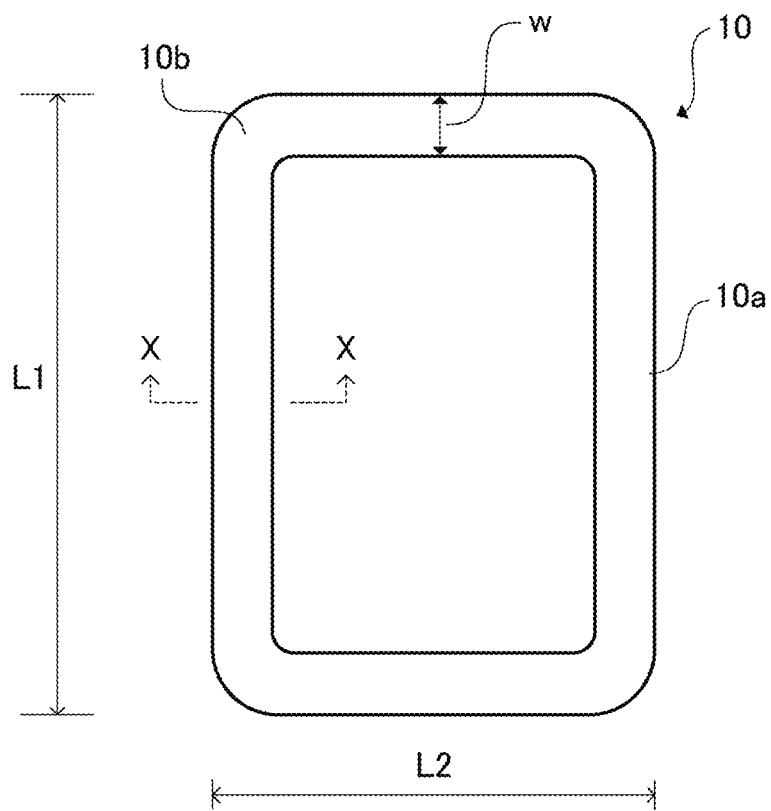
FIG. 1 is a plan view of a pellicle frame in one embodiment of the invention.

The pellicle frame of the invention is a frame of polygonal shape having straight sides 10a and corners 10b. Most often, it is a rectangular shape frame as shown in FIG. 1. The corner 10b where straight sides 10a cross may be rounded as shown in FIG. 1. The frame may be provided with an air passage and a jig hole though not shown in FIG. 1.

The pellicle frame whose outer shape is streamline shaped (or streamlined) can suppress the turbulent flow which occurs upon high-speed scanning motion, mitigate the vibration of a pellicle film by high-speed scanning motion during exposure, and restrain any overlay aggravation, as compared with prior art pellicle frames.

The outer peripheral surface of the pellicle frame is in entirety or in part streamline shaped. The streamline shape is preferably a curvilinear or bowed shape, specifically arcuate or elliptic arc shape. Desirably, the outer peripheral surface of the pellicle frame is shaped or tapered such that its width may gradually decrease from one side (or lower end surface side) adapted to be mounted on an exposure original plate to another side (or upper end surface side) adapted to bear a pellicle film.

Figure 2:
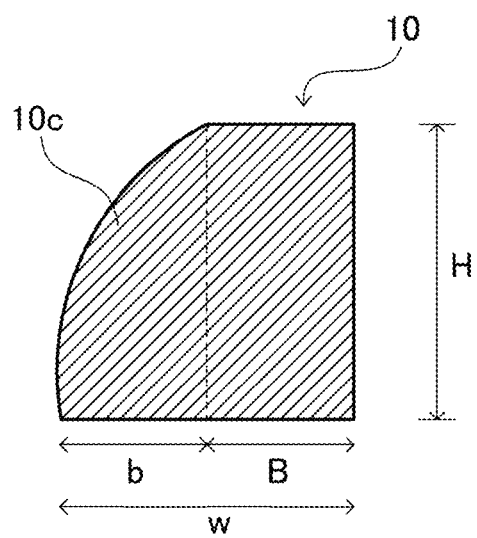
FIG. 2 is a cross-sectional view taken along lines X-X of the pellicle frame in FIG. 1.

The width of the outer peripheral portion 10c of the pellicle frame which is streamline shaped implies the maximum width (b) of the outer peripheral portion 10c included in the overall width (w=B+b) in cross-section of the pellicle frame as shown in FIG. 2, specifically the bottom width (b) of the arcuate section in FIG. 2.

The width (b) of the outer peripheral portion of the pellicle frame which is streamline shaped is preferably at least 50% of the height (H) of the pellicle frame, more preferably at least 70%, even more preferably at least 90%, most preferably 100% of the height (H). If the width (b) of the outer peripheral portion is less than 50% of the height (H), the streamline shaped portion receives greater air resistance during high-speed scanning motion so that a pellicle film is likely to vibrate under the influence of turbulent flow and the overlay may be aggravated. From the standpoint of securing an exposure area, the upper limit of the width (b) of the outer peripheral portion is about 200% of the height (H) of the pellicle frame.

Further referring to FIG. 2, the overall width (w) of the pellicle frame, that is, the width (w) of the pellicle frame on the side (or lower end surface side) adapted to be mounted on an exposure original plate is preferably greater than the width (B) of the pellicle frame on the other side (or upper end surface side) adapted to bear a pellicle film. The width (B) of the pellicle frame is more preferably up to 60%, even more preferably up to 50%, most preferably up to 40% of the width (w) of the pellicle frame. From the standpoint of easy attachment of a pellicle film, the lower limit of the width (B) is preferably at least 30%, though not critical.

While the material of the pellicle frame is not particularly limited, any well-known material may be used. Exemplary materials include metals and alloys such as aluminum, aluminum alloys, steel, stainless steel, brass, Invar, and Super Invar, engineering plastics such as polyethylene (PE) resins, polyamide (PA) resins, polyether ether ketone (PEEK) resins, and fiber composite materials such as glass fiber-reinforced plastics (GFRP) and carbon fiber-reinforced plastics (CFRP)

The pellicle frame is preferably treated so as to color the surface black and if desired, subjected to surface treatment such as coating for preventing dusting. For example, on use of an aluminum alloy, aluminizing, chemical treatment or similar surface treatment is preferably carried out; on use of steel or stainless steel, black chromium plating or similar surface treatment is preferably carried out.

The inner surface of the pellicle frame may be coated with a sticky substance such as acrylic pressure-sensitive adhesive (PSA) or silicone-based PSA for the purpose of trapping or securing floating contaminants. On only the inner surface or the entire surfaces of the pellicle frame, a coating of a non-sticky resin such as acrylic resin or fluoro-resin may be formed for anti-dust-emission purpose. Such coatings of sticky and non-sticky resins may be formed by well-known methods such as spraying, dipping, powder coating and electrodeposition coating.

The outer surface of the pellicle frame may be provided with jig holes or channels for handling or other purposes. The outer surface may be further given marks such as model number, serial number, and bar code by mechanical engraving or laser marking.

A pellicle may be prepared from the pellicle frame by applying a pellicle film, PSA layer or the like thereto.

The pellicle film is prepared by selecting an optimum one from such materials as cellulose resins and fluoro-resins in accordance with a particular exposure light source used, and an optimum film thickness from the range of 0.1 to 10 μm, from the standpoints of transmittance and mechanical strength. The film may be provided with an antireflective layer if necessary. Particularly when EUV radiation is used as the exposure light source, a very thin film having a thickness of up to 1 μm, typically silicon film or carbon film such as graphene film, diamond-like carbon film or carbon nanotube film may be used. The thickness of the pellicle film is preferably up to 500 nm, more preferably up to 300 nm. From the standpoint of film strength, the lower limit of thickness of the pellicle film is preferably at least 20 nm.

While the pellicle film is not limited to a thin film, an assembly of a pellicle film and a support frame for supporting the film may also be employed. For example, a method of preparing a pellicle film by forming a pellicle film on a silicon wafer, and performing back etching on the silicon wafer only in a region to serve as a pellicle film for thereby removing the silicon wafer is acceptable. In this embodiment, the pellicle film is obtained as supported by the silicon frame. The adhesive which is applied to the upper end surface of the pellicle frame for attaching the pellicle film thereto in tension may be any of well-known adhesives such as acrylic adhesives, fluorine-based adhesives and silicone-based adhesives.

The pellicle comprising the pellicle frame of the invention may be provided with a vent for adjusting the pressure of the interior. The vent may be covered on the outside with a filter in the form of a porous thin film of PTFE or the like for preventing entry of contaminants. For the attachment of the filter, the filter may be directly attached to the outside of the pellicle frame via a PSA layer of an adequate material. The location, number and shape of the vent and filter may be determined as appropriate by taking into account the required air flow and convenience of handling.

The PSA layer for attaching the pellicle to a photomask is formed on the lower end surface of the pellicle frame. The material of the PSA layer may be any of well-known materials including rubber-based PSA, urethane-based PSA, acrylic PSA, styrene-ethylene-butylene-styrene (SEBS) PSA, styrene-ethylene-propylene-styrene (SEPS) PSA, and silicone PSA. Preferred is a material giving off a least amount of outgas which causes haze.

The PSA layer preferably has a flatness of up to 30 μm on its surface for ensuring stability after the mounting of the pellicle on a photomask and minimizing the influence on the photomask. The cross-sectional shape and thickness of the PSA layer may be selected as desired, for example, to a convex semicircle shape in cross-section.

On the surface of the PSA layer, a separator in the form of a PET film having a thickness of about 50 to 300 μm and having a releasable surface may be disposed. The separator serves to protect the PSA layer and it may be omitted when suitable means such as a pellicle case or pellicle holder is devised.

The pellicle comprising the pellicle frame is mounted onto a photomask substrate to construct a photomask unit. While the photomask unit is in high-speed scanning motion, patterning is carried out. The positional accuracy or overlay may be evaluated in terms of a positional shift from the destined position in X and Y directions. It is desirable that the shifts in both directions are as small as possible. While it is required for the manufacture of semiconductor devices and LC displays of the next generation to form a pattern with a very small feature size, the positional accuracy or overlay should preferably be up to 1 nm. The positional shifts of the pattern from the destined position in X and Y directions can be measured using, for example, a wafer measuring tool Model YieldStar T-250D by ASML.

The pellicle comprising the pellicle frame is effective particularly when it is applied to the semiconductor device fabrication technology where any distortion of the photomask raises a problem, though not limited to that technology. The invention is applicable to all pellicles wherein the deformation of the photomask caused by the attachment of the pellicle raises a problem, with such applications covering, for example, not only the application for the fabrication of semiconductor devices having one side of about 150 mm long, but also the application for the fabrication of printed boards having one side of 200 to 300 mm long and the fabrication of LC and organic EL displays having one side of 500 to nearly 2,000 mm long.

The pellicle of the invention may serve not only as a protective member for protecting an exposure original plate from particulate contamination in an exposure unit, but also as a protective member for protecting an exposure original plate during its storage or transportation. In preparing a pellicle-covered exposure original plate by mounting a pellicle on an exposure original plate, typically photomask, an electrostatic chucking method, mechanical securing method or the like may be used as well as the aforementioned method of bonding with the photomask PSA.

A further embodiment of the invention is a method for manufacturing a semiconductor device or LC display, which includes the step of exposing a substrate (semiconductor wafer or LC matrix) to radiation through the pellicle-covered exposure original plate. For example, in the lithography step which is one of the steps of the process of manufacturing a semiconductor device or LC display, the stepper is installed with the pellicle-covered exposure original plate and exposure is performed to form a photoresist pattern corresponding to an integrated circuit or the like on a substrate. In general, a projection optical system is used in the EUV lithography such that EUV radiation is reflected by the exposure original plate and directed to the substrate. The exposure step is performed under reduced pressure or in vacuum. Even when contaminants deposit on the pellicle in the lithography step, the contaminants are out of focus on the photoresist-coated wafer, preventing the images of contaminants from causing short- or open-circuiting in the integrated circuit. Therefore, the yield of the lithography step can be improved by using the pellicle-covered exposure original plate.

As the exposure unit for use in the manufacture of semiconductor devices or the like, contact exposure units, proximity exposure units, mirror projection exposure units, step-and-repeat type projection exposure units, and step-and-scan type projection exposure units are generally used.

In the step-and-scan type projection exposure unit, for example, since the circuit pattern is transferred onto a wafer while scanning the pattern on the exposure original plate through a narrow slit, the exposure original plate and the wafer are synchronously moved at a scanning speed corresponding to the magnification of the projection optical system. At this point of time, the pellicle attached to the exposure original plate is accordingly moved.

In the practice of the invention, when the scanning speed is at least 300 mm/sec, the pellicle undergoes effective friction with the ambient air so that the pellicle frame may be triboelectrically charged. The scanning speed has no significant effect when it is slow. When the scanning speed is high, the influence of vibration or the like on the constituent components such as pellicle, photomask, substrate and exposure tool becomes stronger, and the frequency for undesired contaminants to deposit increases. Therefore, the pellicle of the invention is more effective as the scanning speed is higher, and compliant to a high scanning speed of at least 550 mm/sec and even an ultrahigh scanning speed of at least 700 mm/sec. The upper limit of the scanning speed is generally about 2,000 mm/sec, though dependent on the performance of the exposure tool.

EXAMPLES

Examples and Comparative Examples are given below for illustrating the invention, but the invention is not limited thereto.

Example 1

In Example 1, a rectangular-shaped pellicle frame of aluminum alloy having an outer peripheral portion of streamline shape was furnished. The pellicle frame had outer dimensions of 149 mm×115 mm×3.15 mm and a width of 1.95 mm. The pellicle frame was perforated at the center of short sides with filter holes of diameter 0.5 mm.

The pellicle frame had a cross-sectional shape as shown in FIG. 2, B=1.95 mm, H=3.15 mm, and b=3.15 mm. In this example, the bottom width (b) of the arcuate section is 100% of the frame height (H), that is, the width ratio of b/H is 100%.

The pellicle frame was washed with deionized water. Thereafter, the pellicle frame was coated on the upper end surface with a silicone PSA (KE-101A/B by Shin-Etsu Chemical Co., Ltd.) and on the lower end surface with an acrylic PSA (SK-Dyne 1495 by Soken Chemical & Engineering Co., Ltd.).

Subsequently, by attaching a pellicle film composed of perfluorobutenyl vinyl ether-based polymer to the silicone PSA-coated upper end surface of the pellicle frame, and removing a peripheral portion of the pellicle film protruding out of the frame, a pellicle was completed.

The pellicle thus prepared was attached to a photomask substrate of 150 mm square for evaluating a positional accuracy, finding an overlay of 0.54 nm. The conditions under which the pellicle was attached to the photomask included a load of 5 kgf and a loading time of 30 seconds.

Example 2

In Example 2, a rectangular-shaped pellicle frame of aluminum alloy having an outer peripheral portion of streamline shape was furnished. The pellicle frame had outer dimensions of 149 mm×115 mm×3.15 mm and a width of 1.95 mm.

The pellicle frame had a cross-sectional shape as shown in FIG. 2, B=1.95 mm, H=3.15 mm, and b=2.835 mm. In this example, the bottom width (b) of the arcuate section is 90% of the frame height (H), that is, the width ratio of b/H is 90%.

The pellicle thus prepared was attached to a photomask substrate of 150 mm square for evaluating a positional accuracy, finding an overlay of 0.55 nm.

Example 3

In Example 3, a rectangular-shaped pellicle frame of aluminum alloy having an outer peripheral portion of streamline shape was furnished. The pellicle frame had outer dimensions of 149 mm×115 mm×3.15 mm and a width of 1.95 mm.

The pellicle frame had a cross-sectional shape as shown in FIG. 2, B=1.95 mm, H=3.15 mm, and b=2.52 mm. In this example, the bottom width (b) of the arcuate section is 80% of the frame height (H), that is, the width ratio of b/H is 80%.

The pellicle thus prepared was attached to a photomask substrate of 150 mm square for evaluating a positional accuracy, finding an overlay of 0.67 nm.

Example 4

In Example 4, a rectangular-shaped pellicle frame of aluminum alloy having an outer peripheral portion of streamline shape was furnished. The pellicle frame had outer dimensions of 149 mm×115 mm×3.15 mm and a width of 1.95 mm.

The pellicle frame had a cross-sectional shape as shown in FIG. 2, B=1.95 mm, H=3.15 mm, and b=2.205 mm. In this example, the bottom width (b) of the arcuate section is 70% of the frame height (H), that is, the width ratio of b/H is 70%.

The pellicle thus prepared was attached to a photomask substrate of 150 mm square for evaluating a positional accuracy, finding an overlay of 0.75 nm.

Example 5

In Example 5, a rectangular-shaped pellicle frame of aluminum alloy having an outer peripheral portion of streamline shape was furnished. The pellicle frame had outer dimensions of 149 mm×115 mm×3.15 mm and a width of 1.95 mm.

The pellicle frame had a cross-sectional shape as shown in FIG. 2, B=1.95 mm, H=3.15 mm, and b=1.89 mm. In this example, the bottom width (b) of the arcuate section is 60% of the frame height (H), that is, the width ratio of b/H is 60%.

The pellicle thus prepared was attached to a photomask substrate of 150 mm square for evaluating a positional accuracy, finding an overlay of 0.88 nm.

Example 6

In Example 6, a rectangular-shaped pellicle frame of aluminum alloy having an outer peripheral portion of streamline shape was furnished. The pellicle frame had outer dimensions of 149 mm×115 mm×3.15 mm and a width of 1.95 mm.

The pellicle frame had a cross-sectional shape as shown in FIG. 2, B=1.95 mm, H=3.15 mm, and b=1.575 mm. In this example, the bottom width (b) of the arcuate section is 50% of the frame height (H), that is, the width ratio of b/H is 50%.

The pellicle thus prepared was attached to a photomask substrate of 150 mm square for evaluating a positional accuracy, finding an overlay of 0.97 nm.

Comparative Example 1

In Comparative Example 1, a rectangular-shaped pellicle frame of aluminum alloy having an outer peripheral portion of streamline shape was furnished. The pellicle frame had outer dimensions of 149 mm×115 mm×3.15 mm and a width of 1.95 mm.

The pellicle frame had a cross-sectional shape as shown in FIG. 2, B=1.95 mm, H=3.15 mm, and b=1.26 mm. In this example, the bottom width (b) of the arcuate section is 40% of the frame height (H), that is, the width ratio of b/H is 40%.

The pellicle thus prepared was attached to a photomask substrate of 150 mm square for evaluating a positional accuracy, finding an overlay of 1.07 nm.

Comparative Example 2

In Comparative Example 2, a rectangular-shaped pellicle frame of aluminum alloy having an outer peripheral portion of streamline shape was furnished. The pellicle frame had outer dimensions of 149 mm×115 mm×3.15 mm and a width of 1.95 mm.

The pellicle frame had a cross-sectional shape as shown in FIG. 2, B=1.95 mm, H=3.15 mm, and b=0.945 mm. In this example, the bottom width (b) of the arcuate section is 30% of the frame height (H), that is, the width ratio of b/H is 30%.

The pellicle thus prepared was attached to a photomask substrate of 150 mm square for evaluating a positional accuracy, finding an overlay of 1.15 nm.

Comparative Example 3

In Comparative Example 3, a rectangular-shaped pellicle frame of aluminum alloy having an outer peripheral portion of streamline shape was furnished. The pellicle frame had outer dimensions of 149 mm×115 mm×3.15 mm and a width of 1.95 mm.

The pellicle frame had a cross-sectional shape as shown in FIG. 2, B=1.95 mm, H=3.15 mm, and b=0.63 mm. In this example, the bottom width (b) of the arcuate section is 20% of the frame height (H), that is, the width ratio of b/H is 20%.

The pellicle thus prepared was attached to a photomask substrate of 150 mm square for evaluating a positional accuracy, finding an overlay of 1.20 nm.

Comparative Example 4

In Comparative Example 4, a rectangular-shaped pellicle frame of aluminum alloy having an outer peripheral portion of streamline shape was furnished. The pellicle frame had outer dimensions of 149 mm×115 mm×3.15 mm and a width of 1.95 mm.

The pellicle frame had a cross-sectional shape as shown in FIG. 2, B=1.95 mm, H=3.15 mm, and b=0.315 mm. In this example, the bottom width (b) of the arcuate section is 10% of the frame height (H), that is, the width ratio of b/H is 10%.

The pellicle thus prepared was attached to a photomask substrate of 150 mm square for evaluating a positional accuracy, finding an overlay of 1.24 nm.

Comparative Example 5

In Comparative Example 5, a rectangular-shaped pellicle frame of aluminum alloy was furnished. The pellicle frame had outer dimensions of 149 mm×115 mm×3.15 mm and a width of 1.95 mm. The outer peripheral portion of this pellicle frame is not streamline shaped (not shown).

The pellicle thus prepared was attached to a photomask substrate of 150 mm square for evaluating a positional accuracy, finding an overlay of 1.24 nm.

TABLE 1

|  |  | Example | | | | | | Comparative Example | | | | |
| --- | --- | --- | --- | --- | --- | --- | --- | --- | --- | --- | --- | --- |
|  |  | 1 | 2 | 3 | 4 | 5 | 6 | 1 | 2 | 3 | 4 | 5 |
| Outer dimensions | Width B, mm | 1.95 | 1.95 | 1.95 | 1.95 | 1.95 | 1.95 | 1.95 | 1.95 | 1.95 | 1.95 | 1.95 |
|  | Height H, mm | 3.15 | 3.15 | 3.15 | 3.15 | 3.15 | 3.15 | 3.15 | 3.15 | 3.15 | 3.15 | 3.15 |
| Arcuate section | Width b, mm | 3.15 | 2.835 | 2.52 | 2.205 | 1.89 | 1.575 | 1.26 | 0.945 | 0.63 | 0.315 | 0 |
|  | Width ratio, % | 100 | 90 | 80 | 70 | 60 | 50 | 40 | 30 | 20 | 10 | 0 |
| Overlay, nm |  | 0.54 | 0.55 | 0.67 | 0.75 | 0.88 | 0.97 | 1.07 | 1.15 | 1.2 | 1.24 | 1.24 |

As seen from Table 1 tabulating the results, a comparison of Examples 1 to 6 with Comparative Examples 1 to 5 reveals that when the outer peripheral portion of the pellicle frame is streamline shaped and the ratio of the bottom width of the streamlined arcuate section to the height of the frame is high, there is a tendency of reducing overlay aggravation.

REFERENCE SIGNS LIST 10 pellicle frame
10a straight side
10b corner
10c outer peripheral portion
$L_1$ longitudinal length of pellicle frame
$L_2$ lateral length of pellicle frame
H height of pellicle frame
w width of pellicle frame
b bottom width of arcuate section

The invention claimed is:

1. A pellicle frame to construct a photolithography pellicle, comprising
a first side adapted to be mounted on an exposure original plate,
a second side adapted to bear a pellicle film, and
an outer peripheral surface which is in a streamline shape, wherein the streamline shape is a curvilinear or bowed shape such that its width gradually decreases from the first side to the second side of the pellicle frame, a first width (b) of the outer peripheral surface portion of the streamline shape is at least 50% of the height of the pellicle frame and an overall width (w) of the pellicle frame on the first side of the pellicle frame is greater than a second width (B) of the pellicle frame on the second side of the pellicle frame.

2. The pellicle frame of claim 1 wherein the streamline shape is arcuate.

3. The pellicle frame of claim 1 wherein the second width (B) of the pellicle frame on the first side of the pellicle frame is up to 60% of the overall width (w) of the pellicle frame on the first side of the pellicle frame.

4. A pellicle comprising the pellicle frame of claim 1 and a pellicle film.

5. The pellicle of claim 4 wherein the pellicle film has a thickness of up to 500 nm.

6. The pellicle of claim 4 wherein the pellicle is subject to exposure at a scanning speed of at least 300 mm/sec.

7. A pellicle-covered exposure original plate comprising an exposure original plate and the pellicle of claim 4 mounted thereon.

8. An exposure method comprising the step of exposing a substrate to radiation through the pellicle-covered exposure original plate of claim 7.

9. The exposure method of claim 8 wherein the substrate is exposed at a scanning speed of at least 300 mm/sec.

10. A method for manufacturing a semiconductor device comprising the step of exposing a substrate to radiation through the pellicle-covered exposure original plate of claim 7.

11. The method of claim 10 wherein in the exposure step, the substrate is exposed at a scanning speed of at least 300 mm/sec.

12. A method for manufacturing a liquid crystal display comprising the step of exposing a substrate to radiation through the pellicle-covered exposure original plate of claim 7.

13. The method of claim 12 wherein in the exposure step, the substrate is exposed at a scanning speed of at least 300 mm/sec.

14. The pellicle frame of claim 1, wherein the first side is a lower end surface side of the pellicle frame and the second side is an upper end surface side of the pellicle frame and the portion having the outer peripheral surface protrudes outwards from the second side to form the streamline shape.

15. A pellicle frame comprising
a first side adapted to be mounted on an exposure original plate,
a second side adapted to bear a pellicle film, and
a portion having an outer peripheral surface which is in a streamline shape,
wherein the streamline shape is a curvilinear or bowed shape such that its width gradually decreases from the first side to the second side of the pellicle frame, a first width (b) of the outer peripheral surface portion of streamline shape is at least 50% of the height of the pellicle frame and an overall width (w) of the pellicle frame on the first side of the pellicle frame is greater than a second width (B) of the pellicle frame on the second side of the pellicle frame.

16. The pellicle frame of claim 15, wherein the second width (B) of the pellicle frame on the first side of the pellicle frame is up to 60% of the overall width (w) of the pellicle frame on the first side of the pellicle frame.

17. The pellicle frame of claim 15, wherein the first side is a lower end surface side of the pellicle frame and the second side is an upper end surface side of the pellicle frame and the portion having the outer peripheral surface protrudes outwards from the second side to form the streamline shape.

* * * * *